(12) United States Patent
Lakshmanan et al.

(10) Patent No.: US 9,755,244 B2
(45) Date of Patent: Sep. 5, 2017

(54) CONDUCTIVE THIN FILM FOR CARBON CORROSION PROTECTION

(71) Applicant: GM GLOBAL TECHNOLOGY OPERATIONS LLC, Detroit, MI (US)

(72) Inventors: Balasubramanian Lakshmanan, Rochester Hills, MI (US); Jingxin Zhang, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 174 days.

(21) Appl. No.: 14/296,053

(22) Filed: Jun. 4, 2014

(65) Prior Publication Data

US 2015/0357650 A1    Dec. 10, 2015

(51) Int. Cl.
| | | |
|---|---|---|
| B05D 5/12 | (2006.01) |
| H01M 4/88 | (2006.01) |
| H01M 4/04 | (2006.01) |
| H01M 4/1393 | (2010.01) |
| H01M 4/62 | (2006.01) |
| H01M 4/139 | (2010.01) |
| H01M 4/90 | (2006.01) |
| H01M 4/92 | (2006.01) |
| C23C 16/00 | (2006.01) |
| H01M 4/02 | (2006.01) |

(52) U.S. Cl.
CPC ....... *H01M 4/8867* (2013.01); *H01M 4/0428* (2013.01); *H01M 4/139* (2013.01); *H01M 4/1393* (2013.01); *H01M 4/625* (2013.01); *H01M 4/628* (2013.01); *H01M 4/9083* (2013.01); *H01M 4/926* (2013.01); *C23C 16/00* (2013.01); *H01M 2004/027* (2013.01); *H01M 2250/20* (2013.01)

(58) Field of Classification Search
USPC .............. 427/113, 115, 212, 215, 217; 502/180–185; 429/403; 977/890, 891
See application file for complete search history.

(56) References Cited

U.S. PATENT DOCUMENTS

| | | | | |
|---|---|---|---|---|
| 7,084,060 B1 * | 8/2006 | Furukawa | .............. | B82Y 30/00 257/751 |
| 8,236,724 B2 * | 8/2012 | Yoshitake | ................ | B01J 23/42 428/403 |
| 8,629,076 B2 * | 1/2014 | Worsley | .................. | C04B 35/83 427/113 |

(Continued)

OTHER PUBLICATIONS

Ban, C. et al., "Atomic layer deposition of amorphous TiO2 on graphene as an anode for Li-ion batteries," Nanotechnology 24 (2013), pp. 1-6.

(Continued)

*Primary Examiner* — Brian K Talbot
(74) *Attorney, Agent, or Firm* — Brooks Kushman P.C.

(57) ABSTRACT

A method for making corrosion resistant carbon nanoparticles includes a step of heating a carbon powder to a predetermined temperature. The carbon powder includes carbon particles having an average spatial dimension from about 10 to 100 nanometers. The carbon powder is contacted with a vapor of a metal-containing compound. The carbon powder is then contacted with a vapor of an activating compound. These steps are repeated plurality of times to form a metal-containing layer on the carbon particles.

19 Claims, 8 Drawing Sheets

(56) References Cited

U.S. PATENT DOCUMENTS

| | | | | |
|---|---|---|---|---|
| 2003/0059666 A1* | 3/2003 | Kourtakis | H01M 4/8605 | 429/524 |
| 2004/0208994 A1* | 10/2004 | Harkonen | C23C 16/32 | 427/249.1 |
| 2005/0282016 A1* | 12/2005 | Ogonowski | C08G 18/088 | 428/423.1 |
| 2008/0261116 A1* | 10/2008 | Burton | B82Y 10/00 | 429/231.8 |
| 2009/0004552 A1* | 1/2009 | Sun | H01M 4/92 | 429/409 |
| 2009/0214927 A1* | 8/2009 | Dadheech | H01M 8/0206 | 429/434 |
| 2010/0210454 A1* | 8/2010 | Epshteyn | B01J 21/18 | 502/185 |
| 2012/0229096 A1* | 9/2012 | Nazri | B82Y 30/00 | 320/137 |
| 2013/0059073 A1* | 3/2013 | Jiang | C23C 16/4417 | 427/212 |
| 2013/0177808 A1* | 7/2013 | Wang | C23C 16/402 | 429/219 |
| 2013/0323624 A1* | 12/2013 | Wang | H01M 4/926 | 429/524 |

OTHER PUBLICATIONS

Jung, Y. S. et al., "Ultrathin Direct Atomic Layer Deposition on Composite Electrodes for Highly Durable and Safe Li-Ion Batteries," Adv. Mater. 2010, 22, pp. 2172-2176.

Sun, X. et al., "Atomic Layer Deposition of $TiO_2$ on Graphene for Supercapacitors," J. Electrochem. Soc., 159 (4), (2012, pp. A364-A369.

Wang, L. et al., "Ultrathin Oxide Films by Atomic Layer Deposition on Graphene," ACS Publications, Nano Lett., (2012), pp. A-E (5 pgs.).

* cited by examiner

CONDUCTIVE THIN FILM FOR CARBON CORROSION PROTECTION

TECHNICAL FIELD

In at least one aspect, the present invention is related to corrosion resistant carbon supports for fuel cell and battery applications.

BACKGROUND

Fuel cells are used as an electrical power source in many applications. In particular, fuel cells are proposed for use in automobiles to replace internal combustion engines. A commonly used fuel cell design uses a solid polymer electrolyte ("SPE") membrane or proton exchange membrane ("PEM") to provide ion transport between the anode and cathode.

In proton exchange membrane type fuel cells, hydrogen is supplied to the anode as fuel and oxygen is supplied to the cathode as the oxidant. The oxygen can either be in pure form ($O_2$) or air (a mixture of $O_2$ and $N_2$). PEM fuel cells typically have a membrane electrode assembly ("MEA") in which a solid polymer membrane has an anode catalyst on one face, and a cathode catalyst on the opposite face. The anode and cathode layers of a typical PEM fuel cell are formed of porous conductive materials, such as woven graphite, graphitized sheets, or carbon paper to enable the fuel and oxidant to disperse over the surface of the membrane facing the fuel- and oxidant-supply electrodes, respectively. Each electrode has finely divided catalyst particles (for example, platinum particles) supported on carbon particles to promote oxidation of hydrogen at the anode and reduction of oxygen at the cathode. Protons flow from the anode through the ionically conductive polymer membrane to the cathode where they combine with oxygen to form water which is discharged from the cell. The MEA is sandwiched between a pair of porous gas diffusion layers ("GDL") which, in turn, are sandwiched between a pair of non-porous, electrically conductive elements or plates. The plates function as current collectors for the anode and the cathode, and contain appropriate channels and openings formed therein for distributing the fuel cell's gaseous reactants over the surface of respective anode and cathode catalysts. In order to produce electricity efficiently, the polymer electrolyte membrane of a PEM fuel cell must be thin, chemically stable, proton transmissive, non-electrically conductive and gas impermeable. In typical applications, fuel cells are provided in arrays of many individual fuel cell stacks in order to provide high levels of electrical power.

High surface area carbon is widely used in electrochemical devices such as fuel cells, batteries and supercapacitors. In PEM fuel cells, high surface area carbon particles serve as electrocatalyst support and constitute the building block of the electrode structure. However, carbon is prone to electrochemical oxidation reaction (also known as carbon corrosion) in almost any fuel cell system applications, particularly automotive application. Carbon corrosion leads to carbon mass loss and will eventually damage the electrode structure. Carbon corrosion is one of the key durability challenges faced by PEM fuel cell.

Accordingly, there is a need for improved methodology for making carbon supported electrocatalysts for fuel cell applications.

SUMMARY

The present invention solve one or more problems of the prior art by providing in at least one embodiment, a method for making corrosion resistant carbon nanoparticles for fuel cell and battery applications. In particular, an objective of the invention is to develop a thin conductive or semi-conductive film that is also corrosion resistant, on the outside of carbon nanoparticles. Such surface protected carbon can be used as corrosion tolerant catalyst support. The method includes a step of heating a carbon powder to a predetermined temperature. The carbon powder includes carbon particles having an average spatial dimension from about 10 to 100 nanometers. The carbon powder is contacted with a vapor of a metal-containing compound (e.g., titanium-containing, niobium-containing, tin-containing, tantalum-containing, or tungsten-containing compounds) and then with a vapor of an activating compound. These contacting steps are repeated a plurality of times to form a metal-containing layer on the carbon particles. Metal-containing layers include metal oxide layers, metal nitride layers, metal oxynitride layers, and metal carbide layers.

In another embodiment, a method for making corrosion resistant carbon powder coated with platinum is provided. The method includes a step of heating a carbon powder to a predetermined temperature. The carbon powder includes carbon particles has an average spatial dimension from about 10 to 100 nanometers. The carbon powder is contacted with a vapor of titanium tetrahalide and then with a vapor of an activating compound having an OH group. These contacting steps are repeated with a plurality of times to form a titanium oxide layer on the carbon particles. Characteristically, the titanium oxide layer has a thickness from about 1 monolayer to 20 nanometers. Platinum is than optionally deposited on the titanium oxide layer.

In another embodiment, a method for making a corrosion resistant carbon powder is provided. The method includes a step of heating a carbon powder to a predetermined temperature. The carbon powder includes carbon particles having an average spatial dimension from about 10 to 100 nanometers. The carbon powder is contacted with a vapor of a titanium tetrahalide. The carbon powder is then contacted with a vapor of a first activating compound having an OH group and a second activating compound having a $NH_2$ group. These steps of contacting the carbon powder are repeated a plurality of times to form a titanium oxynitride layer on the carbon particles. The carbon powder is either simultaneously contacted with a combination of the first activating compound and the second activating compound in the same step or alternatively contacted with the first activating compound or the second activating compound in separate steps. Characteristically, the titanium oxynitride layer has a thickness from about 1 monolayer to 20 nanometers. Platinum is then optionally deposited on the titanium oxide layer.

In another embodiment, a method for making a corrosion resistant carbon powder by chemical vapor deposition is provided. The method includes a step of heating a carbon powder to a predetermined temperature. The carbon powder includes carbon particles having an average spatial dimension from about 10 to 100 nanometers. The carbon powder reacts with a vapor of a metal-containing compound and a vapor of an activating compound to form a metal-containing layer on the carbon particles. Platinum is then optionally deposited on the metal-containing layer.

DETAILED DESCRIPTION

Reference will now be made in detail to presently preferred compositions, embodiments and methods of the present invention which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Throughout this application, where publications are referenced, the disclosures of these publications in their entireties are hereby incorporated by reference into this application to more fully describe the state of the art to which this invention pertains.

In an embodiment, the prefix "nano" means that the described particles have at least one spatial dimension from about 1 nanometer to about 100 nanometers. In a variation, the prefix "nano" means that the described particles have at least one spatial dimension from about 1 nanometers to about 20 nanometers. In another variation, the prefix "nano" means that the described particles have at least one spatial dimension from about 20 nanometers to about 50 nanometers.

The term "metal oxynitride layer" refers to layers having metal atoms bonded to oxygen atoms and nitrogen atoms. In a refinement, a titanium oxynitride layer has the following formula $TiO_xN_y$ where x is from 0.1 to 1.95 and y is from 0.1 to 1.4.

The term "metal oxide layer" refers to layers having metal atoms bonded to oxygen atoms. Examples include titanium oxides having formula $TiO_2$, tin oxides having formula SnO2, niobium oxides having formula NbO and $Nb_2O_3$, tantalum oxides having formula $Ta_2O_5$, and sub-oxides of these materials. Sub-oxides typically include non-stoichiometric amount of oxygen that may be up to 30 atomic percent lower than the stoichiometric value.

The term "metal Nitride layer" refers to layers having metal atoms bonded to nitrogen atoms. Examples include titanium nitrides having formula TiN, niobium nitrides having formula NbN, tantalum nitrides having formula TaN, and non-stoichiometric nitrides of these materials. Non-stoichiometric nitrides typically include non-stoichiometric amounts of nitrogen that may be up to 30 atomic percent lower than the stoichiometric value.

In one embodiment of the present invention, a method for making corrosion resistant carbon nanoparticles for fuel cell and battery applications is provided. The method includes a step of heating a carbon powder to a predetermined temperature. The carbon powder includes carbon particles having an average spatial dimension from about 10 to 100 nanometers. The carbon powder is contacted with a vapor of a metal-containing compound (e.g., titanium-containing compound) and a vapor of an activating compound. In one refinement, the carbon powder is simultaneously contacted with the vapors in a chemical vapor deposition process. In another refinement, the carbon powder is alternately contacted with the vapor of a metal-containing compound and the vapor of an activating compound in an atomic layer deposition process (ALD). The activating compound is a compound that reacts with the metal-containing compound to form a metal oxide, a metal nitride, a metal oxynitride, and a metal carbide (e.g., WC). In an ALD process, the contacting steps are repeated a plurality of times to form a titanium-containing layer on (e.g., contacting the surface of) the carbon particles.

Figure 1:
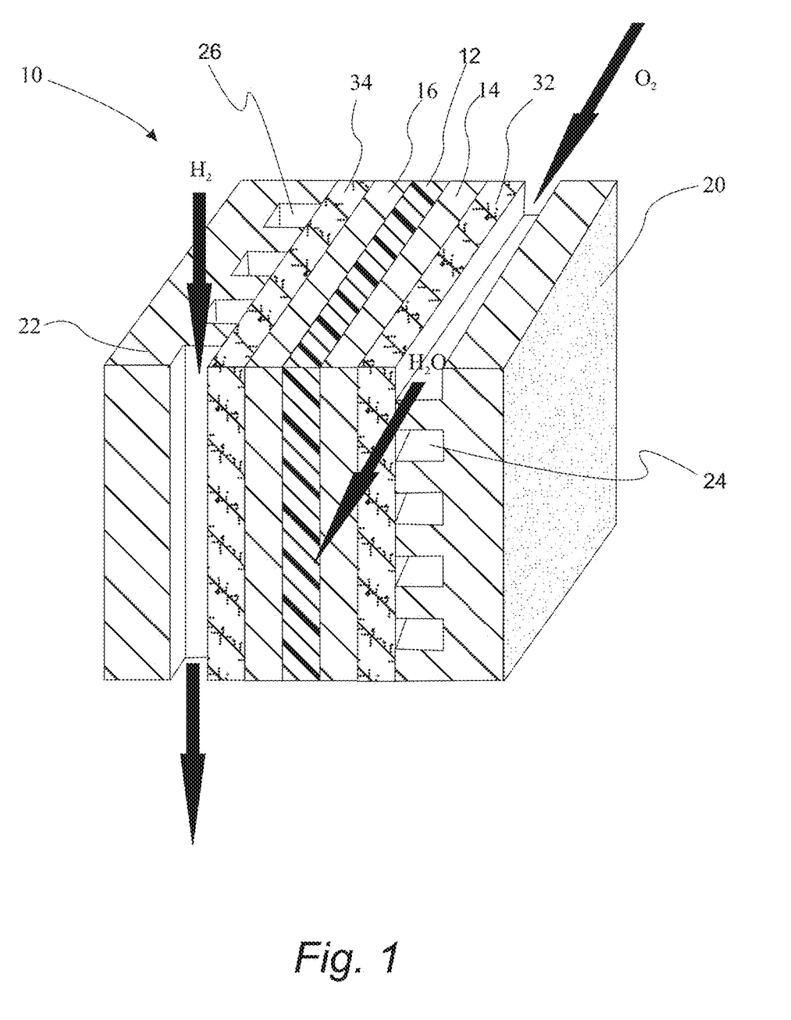
FIG. 1 is a cross sectional view of a fuel cell incorporating carbon particles coated with a titanium-containing layer.

With reference to FIG. 1, a cross sectional view of a fuel cell incorporating the corrosion resistant carbon powder set forth above is provided. PEM fuel cell 10 includes polymeric ion conducting membrane 12 disposed between cathode electro-catalyst layer 14 and anode electro-catalyst layer 16. Fuel cell 10 also includes electrically conductive flow field plates 20, 22 which include gas channels 24 and 26. Flow field plates 28, 30 are either bipolar plates (illustrated) or unipolar plates (i.e., end plates). In a refinement, flow field plates 20, 24 are formed from a metal plate (e.g., stainless steel) optionally coated with a precious metal such as gold or platinum. In another refinement, flow field plates 20, 24 are formed from conducting polymers which also are optionally coated with a precious metal. Gas diffusion layers 32 and 34 are also interposed between flow field plates and a catalyst layer. Cathode electro-catalyst layer 14 and anode electro-catalyst layer 16 include corrosion resistant carbon powder made by the processes set forth below. Advantageously, this corrosion resistant carbon powder enhances the activity of the oxygen reduction reaction when incorporated into cathode electro-catalyst layers.

Figure 2:
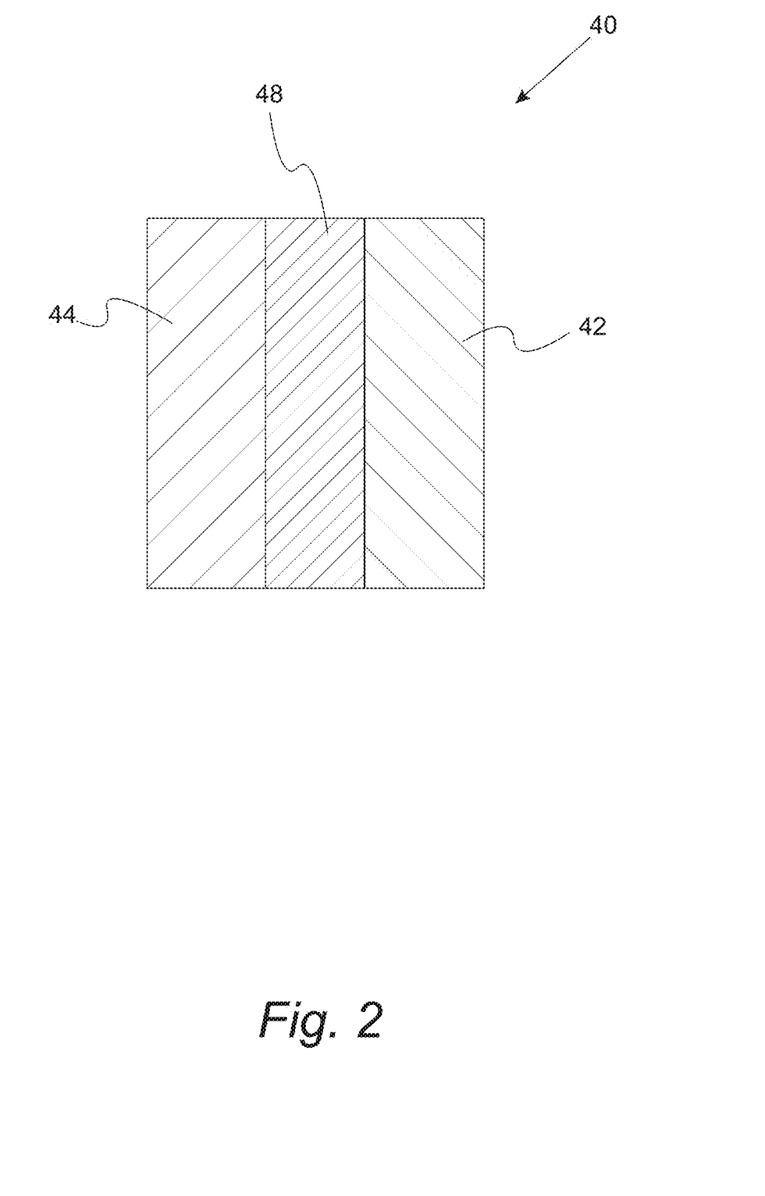
FIG. 2 is a cross sectional view of a lithium ion battery incorporating carbon particles coated with a titanium-containing layer.

With reference to FIG. 2, a schematic cross section of a lithium ion battery incorporating the corrosion resistant carbon powder set forth above is provided. Battery 40 includes anode 42 and cathode 44. Separator 48 is interposed between anode 42 and cathode 44 thereby minimizing electrical shorts between the two electrodes while allowing passages of ions such as lithium ($Li^+$). Advantageously, anode 42 includes the corrosion resistant carbon powder made by the methods set forth below.

Figure 3:
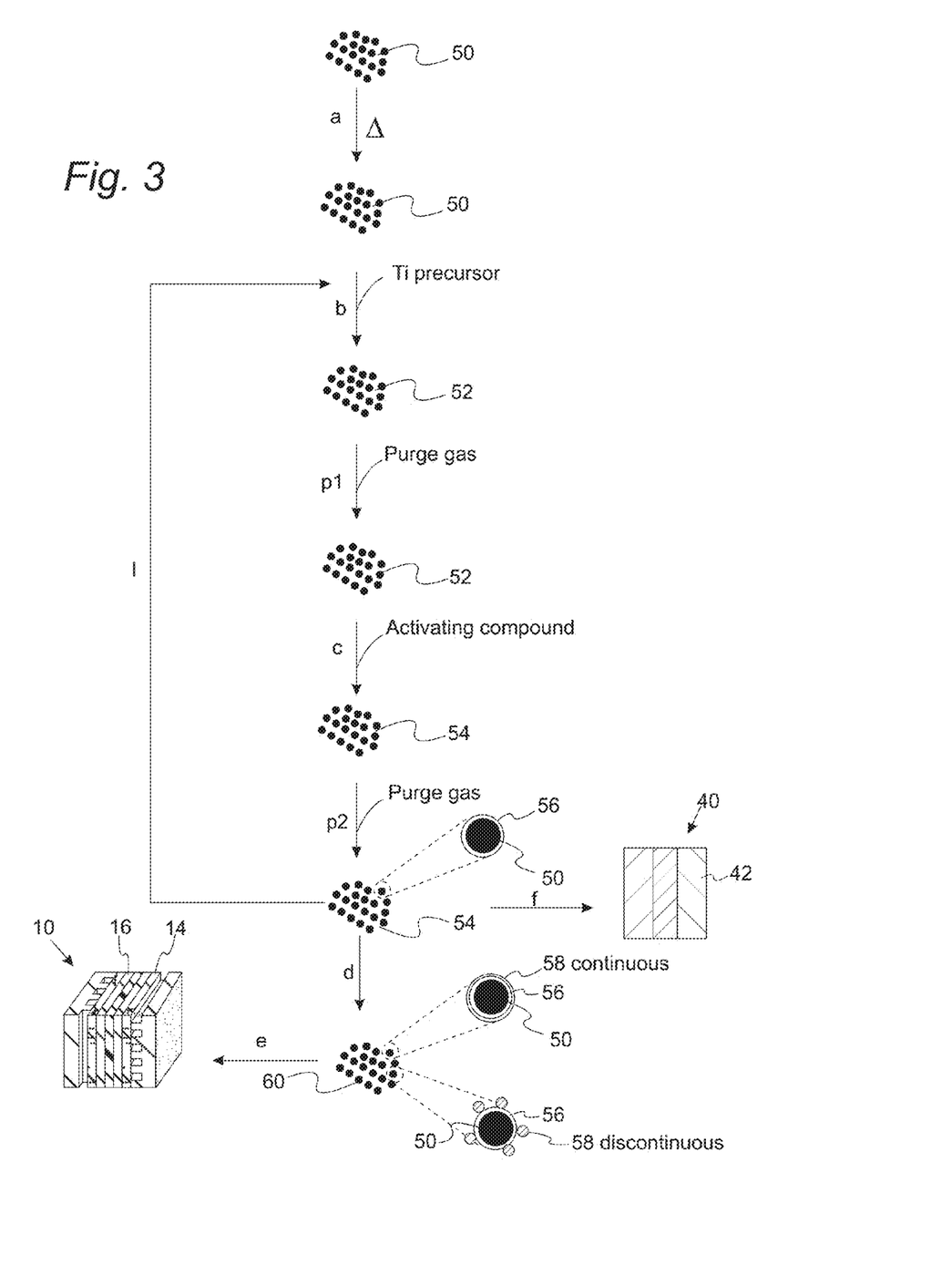
FIG. 3 provides a schematic flowchart illustrating a method for making a carbon particles coated with a titanium-containing layer.

With reference to FIG. 3, a method for making corrosion resistant carbon nanoparticles for fuel cell and battery applications is provided. In step a), carbon powder 50 is heated to a predetermined temperature in an atomic layer deposition (ALD) reactor. In a refinement, carbon powder 50 is heated to a temperature from about 150° C. to 300° C. The carbon powder 50 includes carbon particles having an average spatial dimension from about 10 to 100 nanometers. In a refinement, carbon powder 50 includes carbon particles having an average spatial dimension from about 20 to 70 nanometers. In step b), the carbon powder 50 is contacted with a vapor of a metal-containing compound (e.g., titanium-containing compound) to form carbon particles 52 with a modified metal-containing surface (e.g., modified titanium-containing surface) in a reactor. Suitable metal-containing compounds include but are not limited to titanium tetrahalides (e.g., $TiCl_4$, $TiBr_4$, etc), tantalum halides, niobium halides, tungsten halides (e.g. $WF_6$), metal alkoxides having $C_{1-6}$ alkoxide groups (e.g., titanium alkoxides), and the like. In step p1), carbon particles 52 are purged with an inert gas (e.g., nitrogen, helium, argon, and the like) by purging the reactor. In step c), carbon particles 52 are contacted with a vapor of an activating compound(s) to form carbon particles 54 having a modified surface having residues of the activating compound, and in particular a layer of a titanium oxide, nitride, or oxynitride. In step p2), carbon particles 54 are purged with an inert gas (e.g., nitrogen, helium, argon, and the like).

Still referring to FIG. 3, as illustrated by loop 1, steps b, p1, c, p2 are repeated a plurality of times to form a titanium-containing layer 56 on carbon particles 50. In a refinement, these steps are repeated 1 to 1000 times to build up the thickness of the metal-containing layer 56 (e.g., titanium-containing layer) monolayer by monolayer until a desired thickness is achieved. In a refinement, the thickness of the metal-containing layer 56 is from about a monolayer to 30 nanometers. In another refinement, the thickness of the metal-containing layer 56 is from a 1 nanometer to 30 nanometers. In another refinement, the thickness of the metal-containing layer 56 is from 5 nanometers to 25 nanometers. If metal-containing layer 56 is to be a metal oxide layer (e.g., titanium oxide) then the activating compound includes an OH group when metal halides (e.g., $TiCl_4$) are used as the metal source (e.g., titanium source). If metal-containing layer 56 is to be a metal nitride layer (e.g., a titanium nitride layer) then the activating compound includes an $NH_2$ group when metal halides are used as the titanium source. Examples of suitable activating compounds having an OH group include water and $C_{1-6}$ alcohols. Examples of suitable activating compounds having an $NH_2$ group include ammonia and $C_{1-6}$ primary amines. If metal-containing layer 56 is to be a metal oxynitride layer (e.g., titanium oxynitride layer) then the activating compound or compounds are a combination of a compound having an OH group and a compound having an $NH_2$ group. When the metal-containing compound is a metal alkoxide (e.g., titanium alkoxide), molecular oxygen, water, and ammonia are examples of oxygen and nitrogen source respectively for the activating compounds. In this refinement, molecular oxygen and ammonia are used either simultaneously or alternatively to produce metal oxynitrides (e.g., titanium oxynitrides). If metal-containing layer 56 is to be a tungsten carbide layer then the activating compound can be an alkane such as methane, ethane, and the like. In this latter example, the metal-containing compound is $WF_6$ or a tungsten alkoxide ($C_{1-6}$).

Still referring to FIG. 3, in a variation, a precious metal layer 58 is deposited onto metal layer 56 to form precious metal coated carbon particles 60 in step d). Examples of precious metals for forming precious metal layer include gold, ruthenium, rhodium, palladium, osmium, iridium, or platinum. Platinum is particularly useful for fuel cell catalyst layers. Examples of processes for forming precious metal layer 58 include evaporation, sputtering, wet chemical techniques, and the like. In a refinement, the platinum layer is not a continuous layer. Instead, platinum particles or globules are deposited onto the carbon particles. In another refinement, the amount of platinum on the carbon particles are in an amount from about 10 to 70 weight percent of the combined weight of the coated carbon particle and the platinum. In step e), precious metal coated particles and in particular, platinum coated carbon particles are incorporated into cathode catalyst layer 14 and/or anode catalyst layer 16 of fuel cell 10. In another variation, as set forth above, carbon particles 54 having a metal oxide (e.g., titanium oxide), metal nitride (e.g., titanium nitride), a metal oxynitride (e.g., titanium oxynitride layer), or a metal carbide (e.g., WC) thereon are incorporated into anode layer 42 of lithium ion battery 40 in step f).

Figure 4:
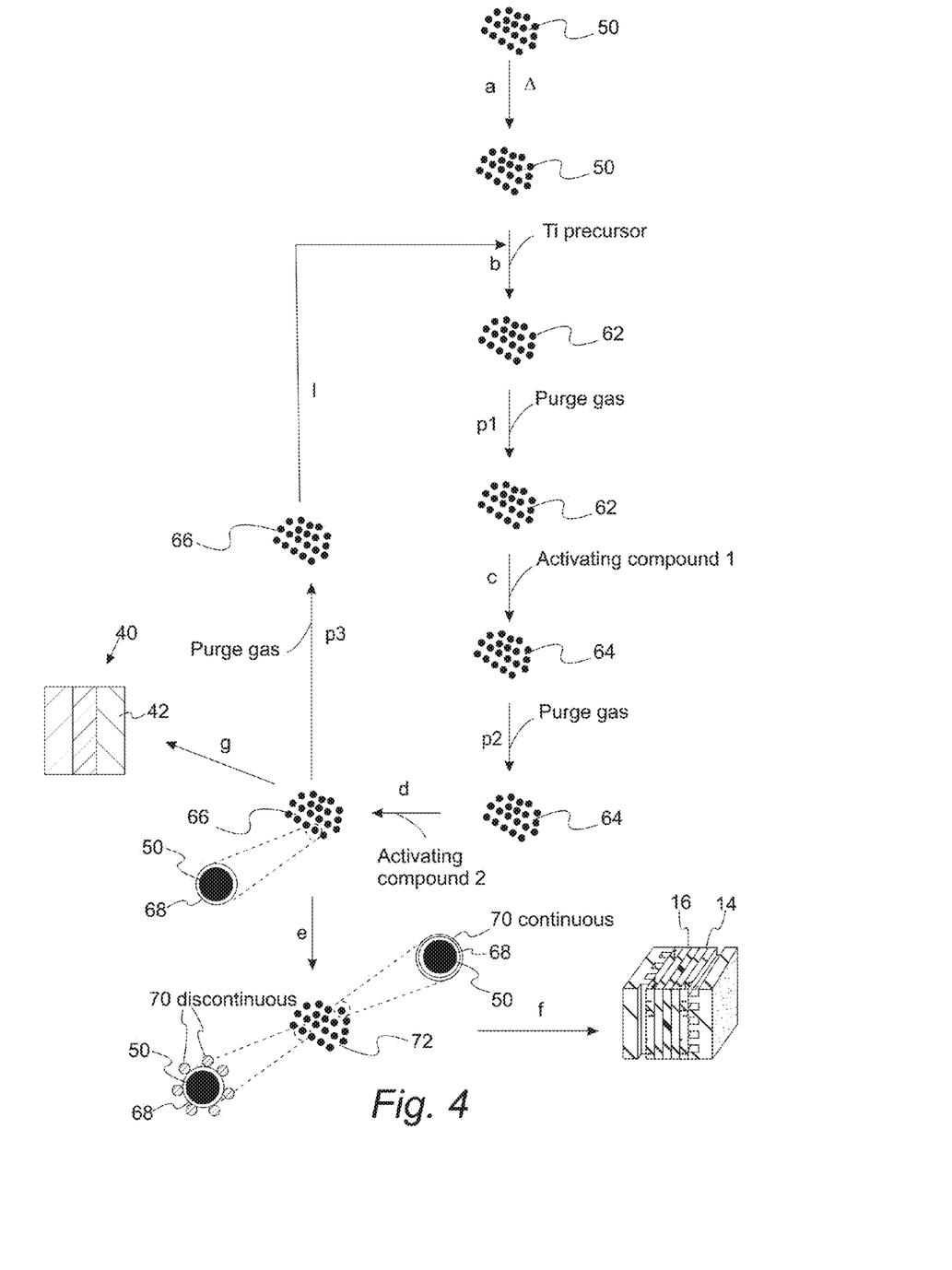
FIG. 4 provides a schematic flowchart illustrating a method for making a carbon particles coated with a titanium-containing layer.

With reference to FIG. 4, a method for making corrosion resistant carbon nanoparticles with a metal oxynitride coating, and in particular, a titanium oxynitride coating, is provided. In step a), carbon powder 50 is heated to a predetermined temperature in an atomic layer deposition (ALD) reactor. In a refinement, carbon powder 50 is heated to a temperature from about 150° C. to 300° C. The carbon powder 50 includes carbon particles having an average spatial dimension from about 10 to 100 nanometers. In a refinement, carbon powder 50 includes carbon particles having an average spatial dimension from about 20 to 70 nanometers. In step b), the carbon powder 50 is contacted with a vapor of a metal-containing compound (e.g., a titanium-containing compound) to form carbon particles 62 with a modified metal-containing (e.g., titanium-containing) surface in a reactor. Suitable metal-containing compounds include but are not limited to metal halides such as titanium tetrahalides (e.g., $TiCl_4$, $TiBr_4$, etc), tin tetrahalides (e.g., $SnCl_4$, $SnBr_4$, etc), tantalum halides, niobium halides, tungsten halides (e.g. $WF_6$), metal alkoxides having $C_{1-6}$ alkoxide groups (e.g., titanium alkoxides), and the like. In step p1), carbon particles 62 are purged with an inert gas (e.g., nitrogen, helium, argon, and the like). In step c), carbon particles 62 are contacted with a vapor of a first activating compound to form carbon particles 64 having a modified surface having residues of the first activating compound and in particular a layer of a metal oxide, nitride, or oxynitride (e.g., titanium oxide, nitride, or oxynitride). In step p2), carbon particles 64 are purged with an inert gas (e.g., nitrogen, helium, argon, and the like). In step d), carbon particles 64 are contacted with a vapor of a second activating compound to form carbon particles 66 having a modified surface having residues of the second activating compound and in particular a layer of a metal oxide, metal nitride, or metal oxynitride. In step p3), carbon particles 66 are purged with an inert gas (e.g., nitrogen, helium, argon, and the like).

Still referring to FIG. 4, as illustrated by loop 1, steps b, p1, c, p2, d, and p3 are repeated a plurality of times to form a metal oxynitride (e.g., titanium oxynitride) layer 68 on carbon particles 50. In a refinement, these steps are repeated 1 to 1000 times to build up the thickness of the metal-containing layer 56 monolayer by monolayer until a desired thickness is achieved. In a refinement, the thickness of the metal-containing (e.g., titanium-containing) layer 56 is from a monolayer to 30 nanometers. In another refinement, the thickness of the metal oxynitride layer 68 is from 5 nanometers to 25 nanometers. In this variation, when first activating compound is an oxygen source the second activating compound is a nitrogen source. Similarly when the first activating compound is a nitrogen source the second activating compound is an oxygen source. Examples of suitable oxygen sources include water and $C_{1-6}$ alcohols when metal halides (e.g, titanium tetrahalides) are used as the metal source and $O_2$ or water when metal alkoxides are used. Examples of suitable nitrogen sources include ammonia and $C_{1-6}$ primary amines. In one refinement, suitable oxygen sources include OH group and suitable nitrogen sources include an $NH_2$ group.

Still referring to FIG. 4, in a variation, a precious metal layer 70 is deposited onto metal oxynitride layer 68 to form precious metal coated carbon particles 72. Examples of precious metals for forming precious metal layer include gold, ruthenium, rhodium, palladium, osmium, iridium, or platinum. Platinum is particularly useful for fuel cell catalyst layers. Examples of processes for forming precious metal layer 70 include evaporation, sputtering, wet chemical techniques, and the like. In a refinement, the platinum layer is not a continuous layer. Instead, platinum particles or globules are deposited onto the carbon particles. In another refinement, the amount of platinum on the carbon particles are in an amount from about 10 to 70 weight percent of the combined weight of the coated carbon particle and the platinum. In step f), precious metal coated particles and in particular, platinum coated carbon particles are incorporated into cathode catalyst layer 14 and/or anode catalyst layer 16 of fuel cell 10. In another variation, as set forth above, carbon particles 66 having a metal oxide, metal nitride, or a metal oxynitride layer (e.g., a titanium oxide, titanium nitride, or a titanium oxynitride layer) thereon are incorporated into anode layer 42 of lithium ion battery 40 in step g).

Figure 5A:
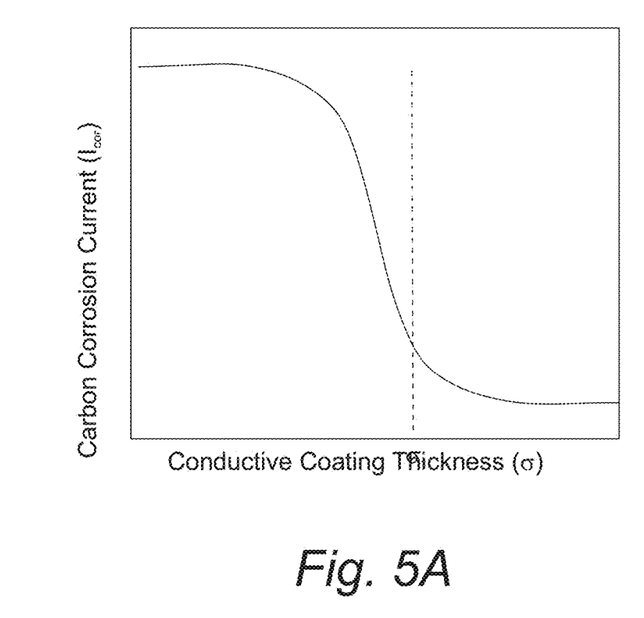
FIG. 5A provides an idealized plot of carbon corrosion current versus titanium-containing layer thickness for coated carbon particles.
Figure 5B:
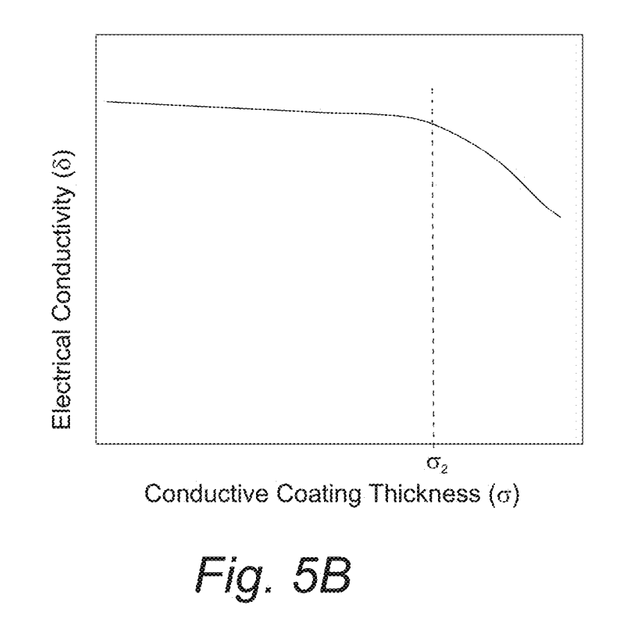
FIG. 5B provides an idealized plot of titanium-layer conductivity versus titanium layer thickness.

As set forth above, several steps of the methods are repeated 1 to 1000 times to build up the thickness of the metal-containing layer 56 monolayer by monolayer until a desired thickness is achieved. FIGS. 5A and 5B illustrate the criteria that optimize the thickness of the titanium-containing layer deposited on the carbon particles. FIG. 5A shows that there is a thickness σ1 at which the carbon corrosion current is reduced to less than 20 percent of its maximum value. FIG. 5B shows that in the case of titanium oxides and oxynitride there is a thickness σ2 at which the electrical conductivity is within 20 percent of its maximum value. In one refinement, the thickness of the metal-containing layer 56 is greater than or equal to σ1. In another refinement, thickness of the metal-containing layer 56 is greater than or equal to σ1 and less than or equal to σ2 since in the case of titanium oxides and oxynitrides σ1 is less than σ2.

Figure 6:
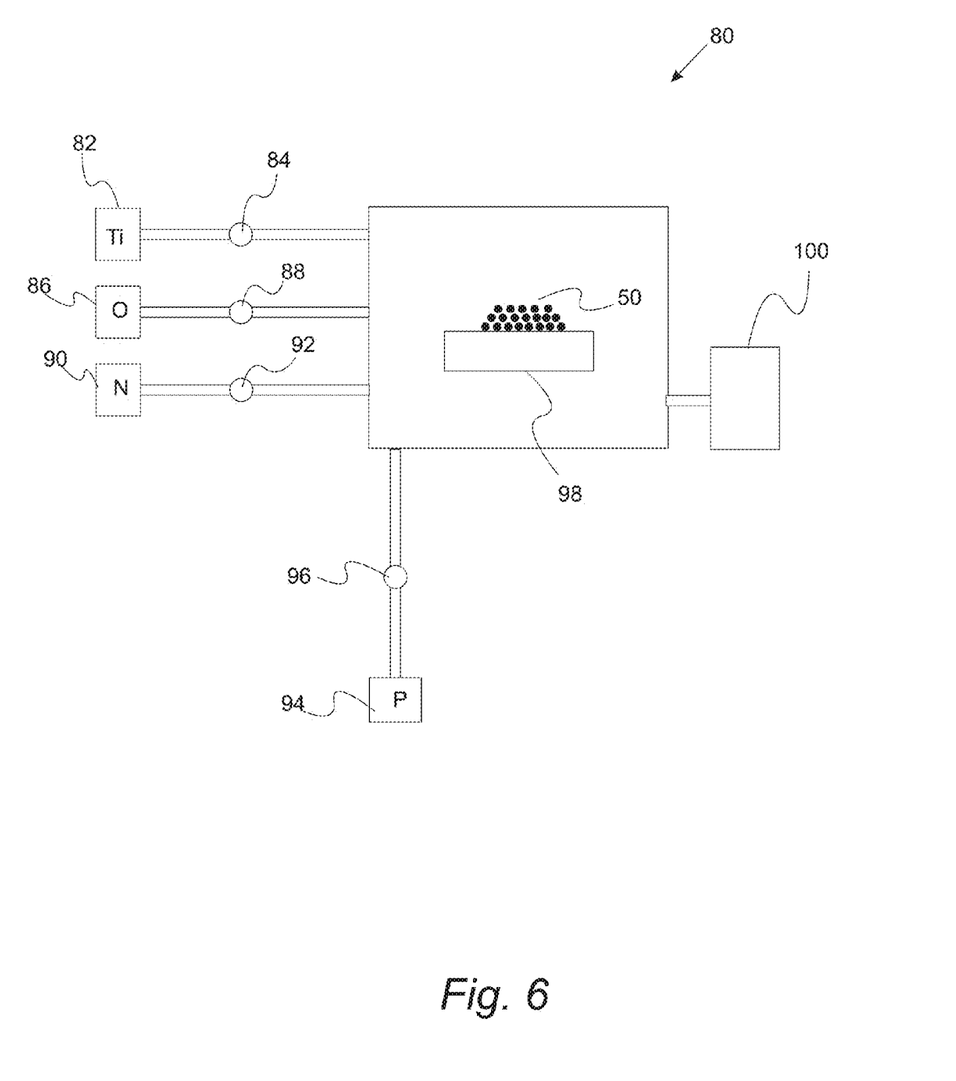
FIG. 6 provides a schematic of an atomic layer deposition system for implements the methods of FIGS. 3 and 4.

With reference FIG. 6, a schematic illustration of an atom layer deposition apparatus for implementing the methods set forth above is provided. Reactor 80 includes metal-containing (e.g., titanium-containing) compound source 82 with associated pulse valve 84, first activating compound source 86 with associated pulse valve 88, second activating compound source 90 with associated pulse valve 92, and purge gas source 94 with associated pulse valve 96. In each case, the respective reagent is introduced by opening of the pulse valve for a predetermined pulse time. Similarly, for purging steps the inert gas is introduced by opening of pulse valve 96 for a predetermined purge time. In one refinement, pulse times and purge times are each independently from about 0.0001 to 200 seconds. In another refinement, pulse and purge times are each independently from about 0.1 to about 10 seconds. During coating, the carbon particles 50 are heated via heater 98 to a temperature suitable to the properties of the chemical precursor(s) and coatings to be formed. In another refinement of the method, the substrate has a temperature from about 50 to 450° C. In another refinement of the method, the substrate has a temperature from about 100 to 250° C. In still another refinement of the method, the substrate has a temperature from about 150 to 400° C. In another refinement of the method, the substrate has a temperature from about 200 to 300° C.

Similarly, the pressure during film formation is set at a value suitable to the properties of the chemical precursors and coatings to be formed. Vacuum system 100 is used to establish the reactor pressure and remove the reagents and purge gas. In one refinement, the pressure is from about $10^{-6}$ Torr to about 760 Torr. In another refinement, the pressure is from about 0.1 millitorr to about 10 Torr. In still another refinement, the pressure is from about 1 to about 100 millitorr. In yet another refinement, the pressure is from about 1 to 20 millitorr.

In another embodiment, a method for making a corrosion resistant carbon powder by chemical vapor deposition is provided. The method includes a step of heating a carbon powder to a predetermined temperature. The carbon powder includes carbon particles having an average spatial dimension from about 10 to 100 nanometers. The carbon powder with a vapor of a metal-containing compound and a vapor of an activating compound to form a metal-containing layer on the carbon particles. Platinum is then optionally deposited on the metal-containing layer. Details of the metal-containing compounds, activating compounds, and the deposed metal-containing layer are the same as those set forth above. Moreover, the depositions temperature and pressures are also the same as set forth above.

The following examples illustrate the various embodiments of the present invention. Those skilled in the art will recognize many variations that are within the spirit of the present invention and scope of the claims.

Figure 7A:
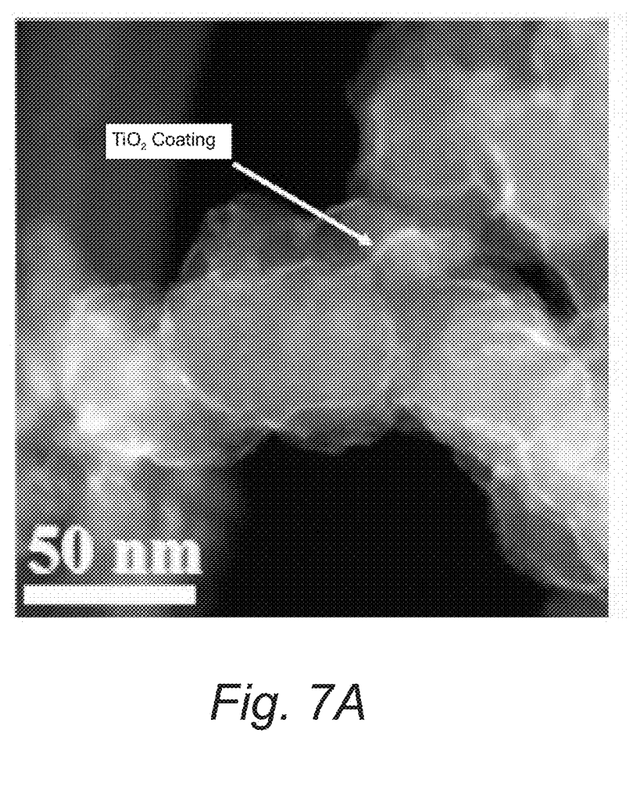
FIG. 7A provides transmission electron micrograph (TEM) images of $TiO_2$ coated carbon particles.
Figure 7B:
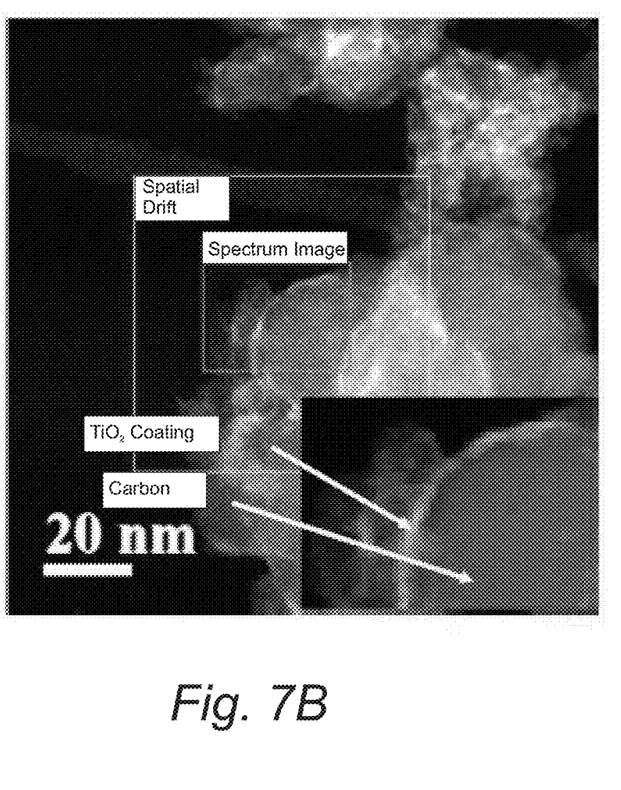
FIG. 7B provides EDX elemental mapping on the composition of $TiO_2$ coated carbon particles.
Figure 8:
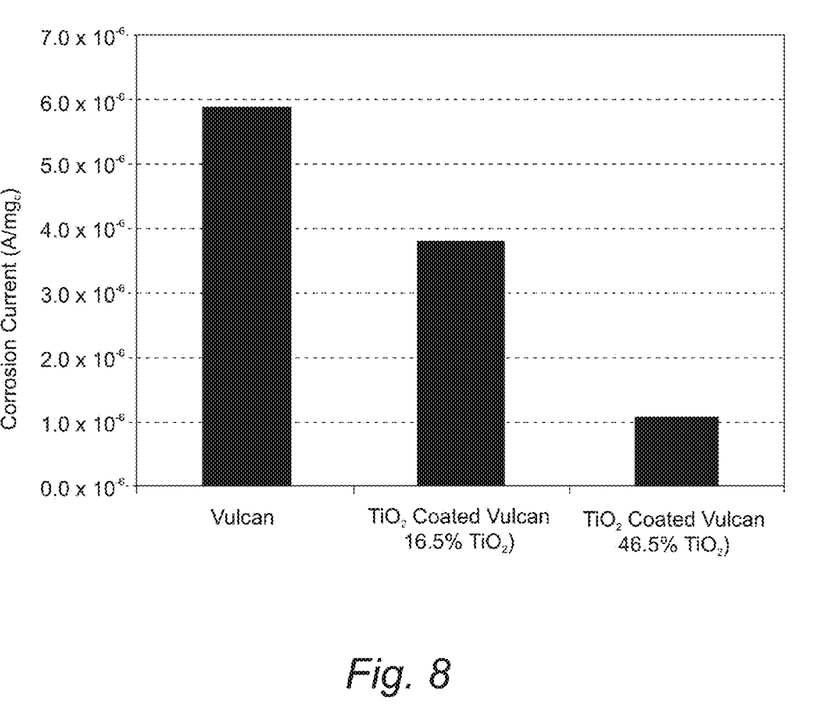
FIG. 8 provides a bar chart illustrating the impact of $TiO_2$ coating on the carbon corrosion current.

FIGS. 7A, 7B, and 8 provide experimental results for titanium oxide films made by the ALD methods set forth above. FIG. 7A provides transmission electron micrograph (TEM) images of $TiO_2$ coated carbon (Vulcan XC-72). FIG. 7B provides EDX elemental mapping on the composition of $TiO_2$ coated carbon (Vulcan XC-72) showing a central carbon core surrounded by a TiO$_2$ coating. FIG. 8 provides a bar chart illustrating the impact of TiO$_2$ coating on the carbon corrosion current. In the corrosion test, carbon or TiO$_2$ coated carbon is corroded at 1.2 V versus a reversible hydrogen electrode (RHE) at room temperature in 0.1 M HClO$_4$.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method comprising:
   a) heating a carbon powder to a predetermined temperature, the carbon powder including carbon particles having an average spatial dimension from about 10 to 100 nanometers;
   b) contacting the carbon powder with a vapor of a metal-containing compound selected from the group consisting of tin-containing compounds, titanium-containing compounds, tantalum-containing compounds, niobium-containing compounds, and tungsten-containing compounds;
   c) contacting the carbon powder with a vapor of an activating compound;
   d) repeating steps b) and c) a sufficient number of times to form a metal-containing layer on the carbon particles having a thickness that is greater than or equal to σ1 and less than or equal to σ2 wherein σ1 is a thickness at which the carbon corrosion current is reduced to less than 20 percent of its maximum value and σ2 is a thickness at which the electrical conductivity is within 20 percent of its maximum value with σ1 being less than σ2;
   e) depositing a precious metal on the metal-containing layer; and
   f) incorporating the carbon particles with the metal-containing layer and the precious metal thereon into an electrocatalyst layer for a fuel cell.

2. The method of claim 1 wherein the metal-containing compound selected from the group consisting of tin-containing compounds, titanium-containing compounds, tantalum-containing compounds, niobium-containing compounds, and tungsten-containing compounds.

3. The method of claim 1 wherein the precious metal is platinum, gold, ruthenium, rhodium, palladium, osmium, iridium, or platinum.

4. The method of claim 1 wherein the metal-containing compound is a metal halide.

5. The method of claim 1 wherein the activating compound is an oxygen-containing compound having an OH group, a nitrogen-containing compound having an NH$_2$ group, or combinations thereof.

6. The method of claim 5 wherein the metal-containing layer is a metal oxide layer.

7. The method of claim 6 wherein the metal-containing layer is titanium oxide.

8. The method of claim 5 wherein the nitrogen-containing compound is ammonia or a C$_{1-6}$ primary amine.

9. The method of claim 8 wherein the metal-containing layer is a metal nitride layer.

10. The method of claim 1 wherein the carbon particles are contacted with both an oxygen-containing compound and a nitrogen-containing compound such that the metal-containing layer is a metal oxynitride.

11. The method of claim 1 wherein the metal-containing layer is tungsten carbide.

12. The method of claim 1 wherein the metal-containing layer is deposited at a pressure from 0.1 millitorr to 10 Torr.

13. The method of claim 1 further comprising purging with an inert gas after step b) prior to step c and after step c) prior to repeated step b).

14. The method of claim 1 wherein the activating compound is a C$_{1-6}$ alcohol.

15. The method of claim 1 wherein the metal-containing compound selected from the group consisting of tantalum-containing compounds, niobium-containing compounds, and tungsten-containing compounds.

16. A method comprising:
   a) heating a carbon powder to a predetermined temperature, the carbon powder include carbon particles having an average spatial dimension from about 10 to 100 nanometers;
   b) contacting the carbon powder with a vapor of a titanium tetrahalide;
   c) contacting the carbon powder with a vapor of an activating compound having an OH group, wherein the activating compound is a C$_{1-6}$ alcohol;
   d) repeating steps b) and c) a sufficient number of times to form a titanium oxide layer on the carbon particles having a thickness that is greater than or equal to σ1 and less than or equal to σ2 wherein σ1 is a thickness at which the carbon corrosion current is reduced to less than 20 percent of its maximum value and σ2 is a thickness at which the electrical conductivity is within 20 percent of its maximum value with σ1 being less than σ2;
   e) depositing platinum on the titanium oxide layer; and
   f) incorporating the carbon particles with the titanium oxide layer and platinum thereon into an electrocatalyst layer for a fuel cell.

17. A method comprising:
   a) heating a carbon powder to a predetermined temperature, the carbon powder include carbon particles having an average spatial dimension from about 10 to 100 nanometers; and
   b) contacting the carbon powder with a vapor of a metal-containing compound and a vapor of an activating compound to form a metal-containing layer on the carbon particles by chemical vapor deposition, the metal-containing compound being selected from the group consisting of tin-containing compounds, titanium-containing compounds, tantalum-containing compounds, niobium-containing compounds, and tungsten-containing compounds wherein the activating compound is a C$_{1-6}$ alcohol;
   c) depositing a precious metal on the metal-containing layer; and
   d) incorporating the carbon particles with the metal-containing layer and the precious metal thereon into an electrocatalyst layer for a fuel cell wherein step b) is repeated a sufficient number of times to form a metal containing layer on the carbon particles having a thickness that is greater than or equal to σ1 and less than or equal to σ2 wherein σ1 is a thickness at which the carbon corrosion current is reduced to less than 20 percent of its maximum value and σ2 is a thickness at which the electrical conductivity is within 20 percent of its maximum value with σ1 being less than σ2.

18. The method of claim 17 wherein the metal-containing layer is titanium oxide or titanium oxynitride.

19. The method of claim 18 wherein the metal-containing layer is titanium titanium oxynitride.

* * * * *